(12) United States Patent
Hikosaka et al.

(10) Patent No.: US 11,955,520 B2
(45) Date of Patent: Apr. 9, 2024

(54) NITRIDE SEMICONDUCTOR WITH MULTIPLE NITRIDE REGIONS OF DIFFERENT IMPURITY CONCENTRATIONS, WAFER, SEMICONDUCTOR DEVICE AND METHOD FOR MANUFACTURING THE SAME

(71) Applicant: KABUSHIKI KAISHA TOSHIBA, Tokyo (JP)

(72) Inventors: Toshiki Hikosaka, Kawasaki (JP); Hajime Nago, Yokohama (JP); Jumpei Tajima, Mitaka (JP); Shinya Nunoue, Ichikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 174 days.

(21) Appl. No.: 17/305,470

(22) Filed: Jul. 8, 2021

(65) Prior Publication Data
US 2022/0190119 A1    Jun. 16, 2022

(30) Foreign Application Priority Data
Dec. 11, 2020    (JP) .................................. 2020-205601

(51) Int. Cl.
*H01L 29/20* (2006.01)
*H01L 21/02* (2006.01)
(Continued)

(52) U.S. Cl.
CPC ...... *H01L 29/2003* (2013.01); *H01L 21/0254* (2013.01); *H01L 21/02576* (2013.01);
(Continued)

(58) Field of Classification Search
CPC ............. H01L 29/2003; H01L 21/0254; H01L 21/02576; H01L 21/02579; H01L 21/0262;
(Continued)

(56) References Cited

U.S. PATENT DOCUMENTS

| 2011/0001127 A1 | 1/2011 | Sakamoto et al. |
| 2014/0061693 A1 | 3/2014 | Yoshida et al. |
| (Continued) | | |

FOREIGN PATENT DOCUMENTS

| JP | 2009-158804 A | 7/2009 |
| JP | 2013-069983 A | 4/2013 |
| (Continued) | | |

*Primary Examiner* — Mark W Tornow
*Assistant Examiner* — David Paul Sedorook
(74) *Attorney, Agent, or Firm* — Oblon, McClelland, Maier & Neustadt, L.L.P.

(57) ABSTRACT

According to one embodiment, a nitride semiconductor includes a nitride member. The nitride member includes a first nitride region including $Al_{x1}Ga_{1-x1}N$ ($0<x1\leq1$), a second nitride region including $Al_{x2}Ga_{1-x2}N$ ($0<x2<1$, $x2<x1$), and a third nitride region. The second nitride region is between the first nitride region and the third nitride region. The third nitride region includes Al, Ga, and N. The third nitride region does not include carbon, alternatively a third carbon concentration in the third nitride region is lower than a second carbon concentration in the second nitride region.

20 Claims, 8 Drawing Sheets

(51) Int. Cl.
    *H01L 29/15*     (2006.01)
    *H01L 29/207*     (2006.01)
    *H01L 29/36*     (2006.01)
    *H01L 29/778*     (2006.01)

(52) U.S. Cl.
    CPC ........ *H01L 21/0262* (2013.01); *H01L 29/155* (2013.01); *H01L 29/207* (2013.01); *H01L 29/36* (2013.01); *H01L 29/7786* (2013.01)

(58) Field of Classification Search
    CPC ..... H01L 29/155; H01L 29/207; H01L 29/36; H01L 29/7786; H01L 21/02458; H01L 21/02505; H01L 29/1079; H01L 29/4236; H01L 29/41766
    See application file for complete search history.

(56) References Cited

U.S. PATENT DOCUMENTS

| | | | | |
|---|---|---|---|---|
| 2015/0263099 | A1* | 9/2015 | Isobe | H01L 29/66522 257/76 |
| 2015/0357418 | A1* | 12/2015 | Lee | H01L 21/0254 257/76 |
| 2016/0056329 | A1* | 2/2016 | Yoshida | H01L 33/007 438/47 |
| 2019/0237550 | A1* | 8/2019 | Uesugi | H01L 29/207 |
| 2020/0411675 | A1* | 12/2020 | Kato | H01L 29/2003 |

FOREIGN PATENT DOCUMENTS

| | | | | |
|---|---|---|---|---|
| JP | 2014-053385 | A | 3/2014 | |
| JP | 2014-229872 | A | 12/2014 | |
| JP | 2015-070091 | A | 4/2015 | |
| JP | 2015070091 | A * | 4/2015 | ........ H01L 21/338 |
| JP | 2015-176936 | A | 10/2015 | |

* cited by examiner

NITRIDE SEMICONDUCTOR WITH MULTIPLE NITRIDE REGIONS OF DIFFERENT IMPURITY CONCENTRATIONS, WAFER, SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2020-205601, filed on Dec. 11, 2020; the entire contents of which are incorporated herein by reference.

FIELD

Embodiments described herein relate generally to a nitride semiconductor, a wafer, a semiconductor device and a method for manufacturing the nitride semiconductor.

BACKGROUND

For example, improvement of characteristics is desired in a semiconductor device based on a nitride semiconductor.

DETAILED DESCRIPTION

Figure 1:
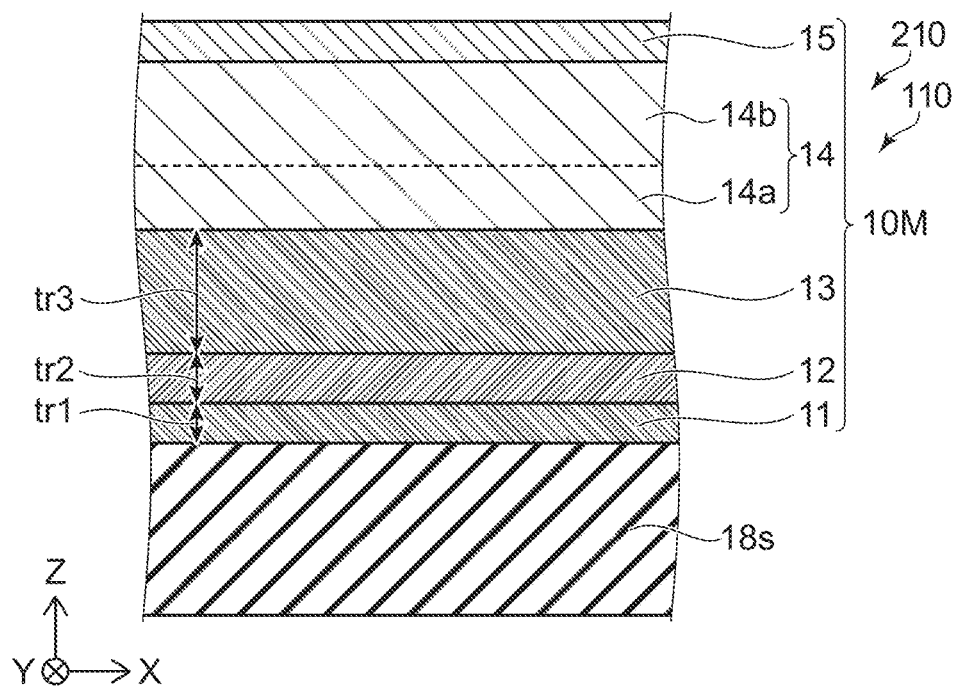
FIG. 1 is a schematic cross-sectional view illustrating a nitride semiconductor according to a first embodiment.

According to one embodiment, a nitride semiconductor includes a nitride member. The nitride member includes a first nitride region including $Al_{x1}Ga_{1-x1}N$ ($0<x1\leq 1$), a second nitride region including $Al_{x2}Ga_{1-x2}N$ ($0<x2<1$, $x2<x1$), and a third nitride region. The second nitride region is between the first nitride region and the third nitride region. The third nitride region includes Al, Ga, and N. The third nitride region does not include carbon, alternatively a third carbon concentration in the third nitride region is lower than a second carbon concentration in the second nitride region.

According to one embodiment, a wafer includes the nitride semiconductor described above and a substrate. The first nitride region is between the substrate and the third nitride region.

According to one embodiment, a nitride semiconductor includes a nitride member. The nitride member includes a first nitride region including $Al_{x1}Ga_{1-x1}N$ ($0<x\leq 1$), a second nitride region including $Al_{x2}Ga_{1-x2}N$ ($0<x2<1$, $x2<x1$), and a third nitride region. The second nitride region is between the first nitride region and the third nitride region. The third nitride region includes Al, Ga, and N. The third nitride region does not include carbon, alternatively a third carbon concentration in the third nitride region is lower than a second carbon concentration in the second nitride region. The nitride member further includes a fourth nitride region including $Al_{x4}Ga_{1-x4}N$ ($0\leq x4<1$), and a fifth nitride region including $Al_{x5}Ga_{1-x4}N$ ($0\leq x5<1$, $x4<x5$). The third nitride region is between the first nitride region and the fifth nitride region. The fourth nitride region is between the third nitride region and the fifth nitride region.

According to one embodiment, a method for manufacturing a nitride semiconductor is disclosed. The method can include forming a second nitride region including $Al_{x2}Ga_{1-x2}N$ ($0<x2<1$, $x2<x1$) and including carbon on a first nitride region including $Al_{x1}Ga_{1-x1}N$ ($0<x1\leq 1$). The method can include forming a third nitride region on the second nitride region. The third nitride region includes Al, Ga, and N. The third nitride region does not include carbon, alternatively a third carbon concentration in the third nitride region is lower than a second carbon concentration in the second nitride region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a nitride semiconductor according to a first embodiment.

As shown in FIG. 1, the nitride semiconductor 110 according to the embodiment includes a nitride member 10M. The nitride member 10M includes a first nitride region 11, a second nitride region 12, and a third nitride region 13. The nitride member 10M may include a fourth nitride region 14 and a fifth nitride region 15. The fourth nitride region 14 and the fifth nitride region 15 correspond to functional regions. The fourth nitride region 14 and the fifth nitride region 15 are provided as necessary and may be omitted. The nitride semiconductor 110 may include a substrate 18s.

The first nitride region 11 includes $Al_{x1}Ga_{1-x1}N$ ($0<x1\leq 1$). The composition ratio x1 of Al in the first nitride region 11 is, for example, not less than 0.35 and not more than 1. In one example, the first nitride region 11 includes AlN. The first nitride region 11 may include, for example, multiple AlGaN films having different Al composition ratios. The first nitride region 11 may include, for example, an AlN film and an $Al_{0.35}Ga_{0.65}N$ film.

The second nitride region 12 includes $Al_{x2}Ga_{1-x2}N$ (0<x2<1, x2<x1) and includes carbon. The composition ratio x2 of Al in the second nitride region 12 is, for example, not less than 0.08 and not more than 0.28. The second nitride region 12 is, for example, AlGaN (for example, $Al_{0.15}Ga_{0.85}N$).

There is a second nitride region 12 between the first nitride region 11 and the third nitride region 13. The third nitride region 13 includes Al, Ga and N. In one example, the third nitride region 13 is, for example, AlGaN (eg, $Al_{0.30}Ga_{0.70}N$). As will be described later, the third nitride region 13 may include, for example, stacked films having different Al composition ratios. The third nitride region 13 does not include carbon. Alternatively, a carbon concentration in the third nitride region 13 (third carbon concentration) is lower than a carbon concentration in the second nitride region 12 (second carbon concentration).

The direction from the first nitride region 11 to the second nitride region 12 is defined as the first direction. The first direction corresponds to, for example, the stacking direction. The first direction is the Z-axis direction. One direction perpendicular to the Z-axis direction is defined as the X-axis direction. The direction perpendicular to the Z-axis direction and the X-axis direction is defined as the Y-axis direction. For example, the first to third nitride regions 11 to 13 are layered so as to spread substantially parallel to the XY plane. For example, the first to third nitride regions 11 to 13 are films that spread substantially parallel to the XY plane.

When the substrate 18s is provided, there is a first nitride region 11 between the substrate 18s and the third nitride region 13. The substrate includes, for example, silicon. The substrate 18s may include at least one selected from the group consisting of silicon, sapphire, silicon carbide (SiC), aluminum nitride (AlN), and gallium nitride (GaN). The substrate 18s is, for example, a silicon substrate.

The wafer 210 according to the embodiment includes the nitride semiconductor 110 according to the embodiment and the substrate 18s. In the wafer 210, there is a first nitride region 11 between the substrate 18s and the third nitride region 13.

As described above, the nitride member 10M may include the fourth nitride region 14 and the fifth nitride region 15. The fourth nitride region 14 includes $Al_{x4}Ga_{1-x4}N$ (0≤x4<1). The composition ratio x4 of Al in the fourth nitride region 14 is, for example, not less than 0 and not more than 0.5. The fourth nitride region 14 includes, for example, GaN. The composition ratio x4 of Al in the fourth nitride region 14 is lower than the composition ratio of Al in the third nitride region 13.

As shown in FIG. 1, the fourth nitride region 14 may include a first film region 14a and a second film region 14b. The first film region 14a is between the third nitride region 13 and the second film region 14b. The first film region 14a includes carbon. The second film region 14b does not include carbon. Alternatively, the carbon concentration in the second film region 14b is lower than the carbon concentration in the first film region 14a. By providing the first film region 14a including carbon, for example, a low dislocation density can be easily obtained. The second film region 14b, which has a low carbon concentration, makes it easy to obtain, for example, high electron mobility.

The fifth nitride region 15 includes $Al_{x5}Ga_{1-x5}N$ (0<x5≤1, x4<x5). The composition ratio x5 of Al in the fifth nitride region 15 is, for example, not less than 0.05 and not more than 0.35. The fifth nitride region 15 is, for example, AlGaN. The third nitride region 13 is between the first nitride region 11 and the fifth nitride region 15. The fourth nitride region 14 is between the third nitride region 13 and the fifth nitride region 15.

For example, a carrier region is formed in a portion of the fourth nitride region 14 facing the fifth nitride region 15. The carrier region is, for example, a two-dimensional electron gas. In a semiconductor device based on a nitride semiconductor 110, the carrier region is used for the operation of the semiconductor device.

In the embodiment, as described above, the second nitride region 12 including carbon is provided. As a result, for example, in the nitride member 10M, a low dislocation density can be obtained. It is considered that this is because the direction of dislocations is bent in the second nitride region 12 including carbon and the number of dislocations extending above the second nitride region 12 is reduced. When the carbon concentration in the second nitride region 12 is higher than the carbon concentration in the third nitride region 13, for example, the strain applied to the third nitride region 13 becomes large. This reduces the dislocation density.

The nitride member 10M is formed by MOCVD (metal organic chemical vapor deposition) or the like by use of, for example, a raw material gas including a group III element (Al or Ga) and a raw material gas including a group V element (N), for example. In the formation of the second nitride region 12, for example, depending on the treatment conditions, carbon contained in the raw material gas is easily incorporated into the nitride. As a result, the concentration of carbon in the second nitride region 12 can be increased. The carbon concentration in the second nitride region 12 can be controlled by the treatment conditions.

Figure 2:
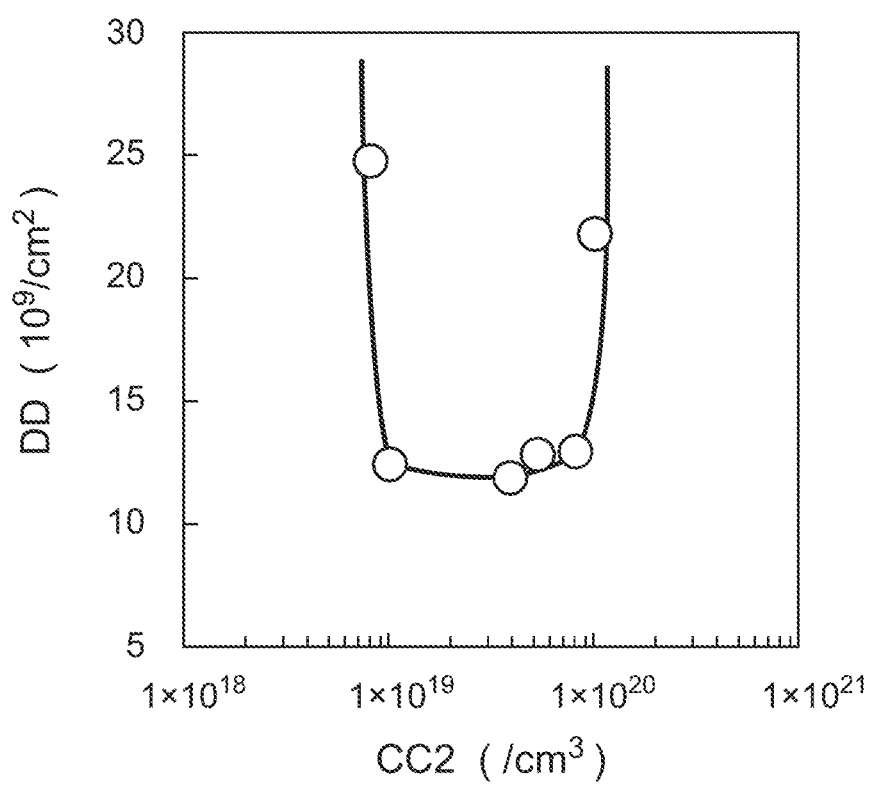
FIG. 2 is a graph view illustrating characteristics of the nitride semiconductor.

FIG. 2 is a graph view illustrating characteristics of the nitride semiconductor.

The horizontal axis of FIG. 2 is the carbon concentration (second carbon concentration CC2) in the second nitride region 12. The vertical axis is the dislocation density DD in the fourth nitride region 14. In the example of FIG. 2, the carbon concentration (third carbon concentration) in the third nitride region 13 is about $5 \times 10^{18}/cm^3$.

As shown in FIG. 2, when the second carbon concentration CC2 is not less than $8 \times 10^{18}/cm^3$ higher than the third carbon concentration, the dislocation density DD becomes low. It is considered that this is because the propagation direction of dislocations tends to bend in the second nitride region 12. When the carbon concentration in the second nitride region 12 is high, the lateral growth of the second nitride region 12 is promoted. As a result, it is considered that the dislocations are bent and the dislocation density DD is lowered.

As shown in FIG. 2, when the second carbon concentration CC2 is excessively high, the dislocation density DD becomes high. It is considered that this is because the excessively high carbon content causes carbon to be mixed between the crystal lattices, resulting in low crystal quality.

In the embodiment, for example, the second carbon concentration CC2 is preferably not less than $1 \times 10^{19}/cm^3$. For example, the second carbon concentration CC2 is preferably not more than $8 \times 10^{19}/cm^3$, for example. A low dislocation density DD is obtained. It is possible to provide a nitride semiconductor whose characteristics can be improved.

For example, in the formation of the second nitride region 12, oxygen included in the raw material gas is less likely to be incorporated into the nitride depending on the treatment conditions, for example. As a result, the concentration of oxygen included in the second nitride region 12 can be lowered. The concentration of oxygen included in the second nitride region 12 can be controlled by the treatment conditions. Oxygen may be included in the raw material gas, for example. A gas including oxygen may be supplied separately from the above-mentioned raw material gas.

Figure 3:
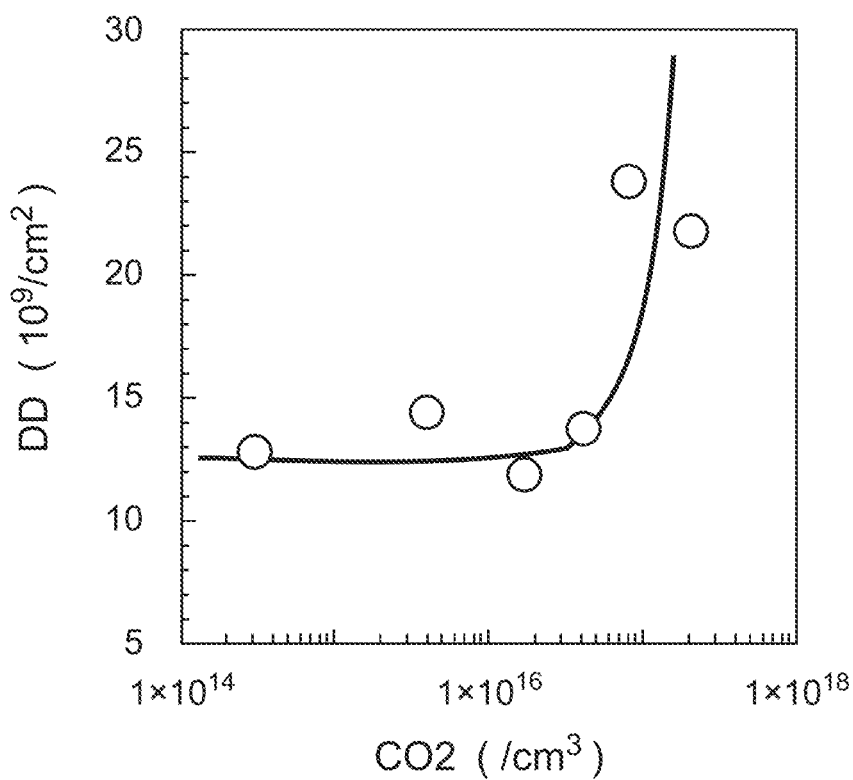
FIG. 3 is a graph view illustrating characteristics of the nitride semiconductor.

FIG. 3 is a graph illustrating characteristics of the nitride semiconductor.

The horizontal axis of FIG. 3 is the oxygen concentration (second oxygen concentration CO2) in the second nitride region 12. The vertical axis is the dislocation density DD. In the example of FIG. 3, the oxygen concentration (third oxygen concentration) in the third nitride region 13 is $6 \times 10^{16}/cm^3$.

As shown in FIG. 3, when the second oxygen concentration CO2 is not more than $4 \times 10^{16}/cm^3$ lower than the third oxygen concentration, the dislocation density DD becomes low. It is considered that this is because the lattice relaxation is reduced in the second nitride region 12. When the oxygen concentration is low, the lattice relaxation is reduced in the second nitride region 12. As a result, the dislocation density is considered to be reduced. When the oxygen concentration is low, the strain applied to the third nitride region 13 becomes large. When the oxygen concentration in the second nitride region 12 is lower than the oxygen concentration in the third nitride region 13, for example, the strain applied to the third nitride region 13 becomes large. This reduces the dislocation density.

In the embodiment, for example, the second oxygen concentration CO2 is preferably not more than $4 \times 10^{16}/cm^3$. The second oxygen concentration CO2 may be not less than $3 \times 10^{14}/cm^3$. The second oxygen concentration CO2 may not be excessively low.

As described above, the second nitride region 12 preferably does not include oxygen. Alternatively, the oxygen concentration CO (second oxygen concentration) in the second nitride region 12 is preferably lower than the oxygen concentration CO (third oxygen concentration) in the third nitride region 13. It is possible to provide a nitride semiconductor whose characteristics can be improved.

For example, it is preferable that the Al composition ratio in the third nitride region 13 is higher than the Al composition ratio (composition ratio x2) in the second nitride region 12 and lower than the Al composition ratio (composition ratio x1) in the first nitride region 11. The composition ratio may be the average composition ratio in each nitride region. Due to such a composition ratio relationship, appropriate stress or strain is likely to occur, and low dislocation density DD is likely to occur.

The Al composition ratio in the third nitride region 13 is preferably not less than 0.18 and not more than 0.38. At such a composition ratio, appropriate stress or strain is likely to occur, and a low dislocation density DD is likely to be obtained.

In the embodiment, the Al composition ratio (composition ratio x2) in the second nitride region 12 is preferably not less than 0.08 and not more than 0.28, for example. At such a composition ratio x2, appropriate stress or strain is likely to occur, and a low dislocation density DD is likely to be obtained.

As shown in FIG. 1, the first nitride region 11 has a thickness (first nitride region thickness tr1) along the first direction (Z-axis direction). The first nitride region thickness tr1 is, for example, not less than 10 nm and not more than 1500 nm. In one example, the first nitride region thickness tr1 is about 150 nm.

As shown in FIG. 1, the second nitride region 12 has a thickness along the first direction (second nitride region thickness tr2). The second nitride region thickness tr2 is, for example, not less than 50 nm and not less than 2000 nm. In one example, the second nitride region thickness tr2 is about 200 nm.

As shown in FIG. 1, the third nitride region 13 has a thickness along the first direction (third nitride region thickness tr3). The third nitride region thickness tr3 is, for example, not less than 100 nm and not more than 7,000 nm. In one example, the third nitride region thickness tr3 is about 3000 nm.

Figure 4:
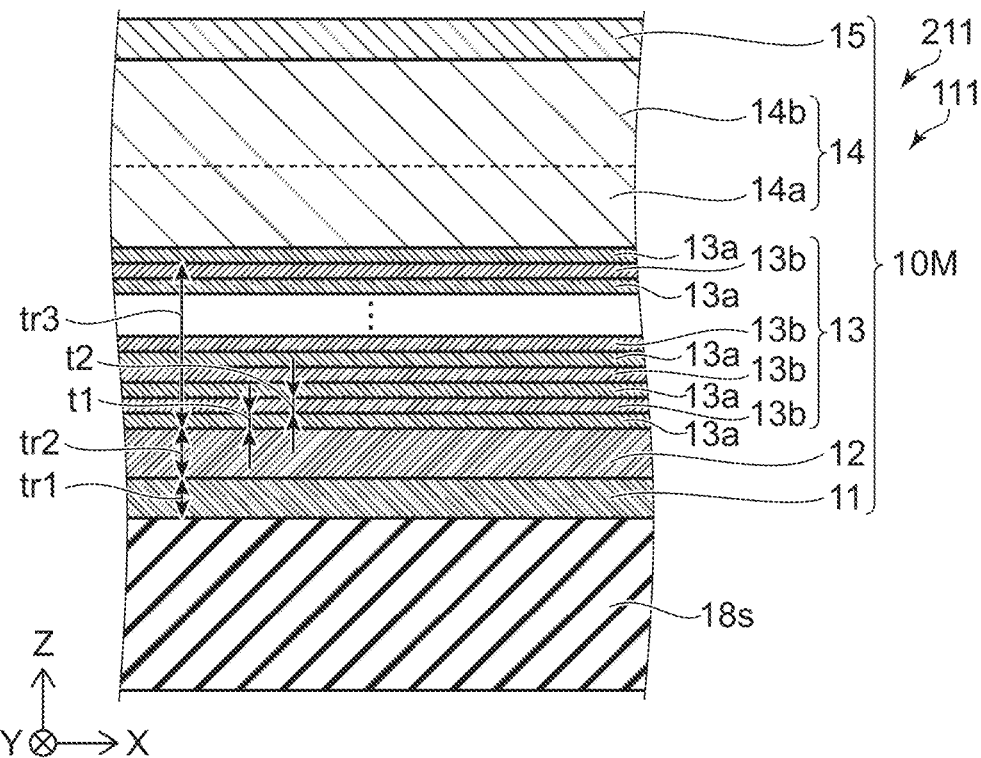
FIG. 4 is a schematic cross-sectional view illustrating the nitride semiconductor according to the first embodiment.

FIG. 4 is a schematic cross-sectional view illustrating the nitride semiconductor according to the first embodiment.

As shown in FIG. 4, in a nitride semiconductor 111 and a wafer 211 according to the embodiment, the third nitride region 13 has a stacked structure.

For example, the third nitride region 13 includes multiple first regions 13a and multiple second regions 13b. In the first direction (Z-axis direction) from the first nitride region 11 to the second nitride region 12, one of the multiple first regions 13a is between one of the multiple second regions 13b and another one of the multiple second regions 13b. The above one of the multiple second regions 13b is between the above one of the multiple first regions 13a and another one of the multiple first regions 13a. For example, the first region 13a and the second region 13b are alternately provided along the Z-axis direction.

The first region 13a includes $Al_{y1}Ga_{1-y1}N$ ($0<y1\leq1$). The second region 13b includes $Al_{y2}Ga_{1-y2}N$ ($0\leq y2<y1$).

The Al composition ratio (composition ratio y1) in the first region 13a is, for example, not less than 0.75 and not more than 1. In one example, the first region 13a is AlN.

The Al composition ratio (composition ratio y2) in the second region 13b is, for example, not less than 0.06 and not more than 0.3. In one example, the second region 13b is $Al_{0.13}Ga_{0.87}N$.

In one example, the composition ratio y1 is less than or equal to the composition ratio x1. In one example, the composition ratio y2 is higher than the composition ratio x2.

For example, one of the multiple first regions 13a may be in contact with the second nitride region 12. For example, one of the multiple second regions 13b may be in contact with the second nitride region 12. For example, one of the multiple first regions 13a may be in contact with the fourth nitride region 14. For example, one of the multiple second regions 13b may be in contact with the fourth nitride region 14. The multiple first regions 13a and the multiple second regions 13b may form, for example, a superlattice structure. The absolute value of the difference between the number of the multiple first regions 13a and the number of the multiple second regions 13b may be 0 or 1. The number of the multiple first regions 13a is, for example, not less than 10 and not more than 200.

Each of the multiple first regions 13a has a first region thickness t1 along the first direction (Z-axis direction). For example, the first region thickness t1 is thinner than the second nitride region thickness tr2 along the first direction of the second nitride region 12. Each of the multiple second regions 13b has a second region thickness t2 along the first direction. For example, the second region thickness t2 is thinner than the second nitride region thickness tr2. For example, the first region thickness t1 is thinner than the second region thickness t2.

For example, the first region thickness t1 along the first direction of each of the multiple first regions 13a is thinner than the first nitride region thickness tr1 along the first direction of the first nitride region 11. The second region thickness t2 along the first direction of each of the multiple second regions 13b is thinner than the first nitride region thickness tr1.

The thickness t1 of the first region is, for example, not less than 3 nm and not more than 10 nm. In one example, the first region thickness t1 is 5 nm. The second region thickness t2 is, for example, not less than 15 nm and not more than 40 nm. In one example, the second region thickness t2 is 25 nm.

In the third nitride region 13 having such a structure, for example, at the interface between the first region 13a and the second region 13b, dislocations tend to bend. It is easy to obtain a lower dislocation density DD. By providing multiple regions having different Al composition ratios, for example, a high breakdown voltage can be easily obtained.

An effective Al composition ratio za3 in the third nitride region 13 including the multiple first regions 13a and the multiple second regions 13b can be obtained by the following. As described above, each of the multiple first regions 13a has a first region thickness t1 along the first direction. Each of the multiple second regions 13b has a second region thickness t2 along the first direction. Using the first region thickness t1, the second region thickness t2, the composition ratio y1, and the composition ratio y2, the effective Al composition ratio za3 in the third nitride region 13 is represented by $$za3=(y1\cdot t1+y2\cdot t2)/(t1+t2).$$

The effective Al composition ratio za3 can be regarded as the average Al composition ratio in the third nitride region 13 including the multiple first regions 13a and the multiple second regions 13b.

In the embodiment, the effective Al composition ratio za3 in the third nitride region 13 is preferably higher than the Al composition ratio (composition ratio x2) in the second nitride region 12. For example, the composition ratio x2, the first region thickness t1, the second region thickness t2, the composition ratio y1, and the composition ratio y2 are preferable to satisfy $$x2<\{(y1\cdot t1+y2\cdot t2)/(t1+t2)\}.$$

In the embodiment, the effective Al composition ratio za3 in the third nitride region 13 is preferably lower than the Al composition ratio (composition ratio x1) in the first nitride region 11. For example, the composition ratio x2, the first region thickness t1, the second region thickness t2, the composition ratio y1, and the composition ratio y2 are preferable to satisfy $$\{(y1\cdot t1+y2\cdot t2)/(t1+t2)\}<x1.$$

Figure 5:
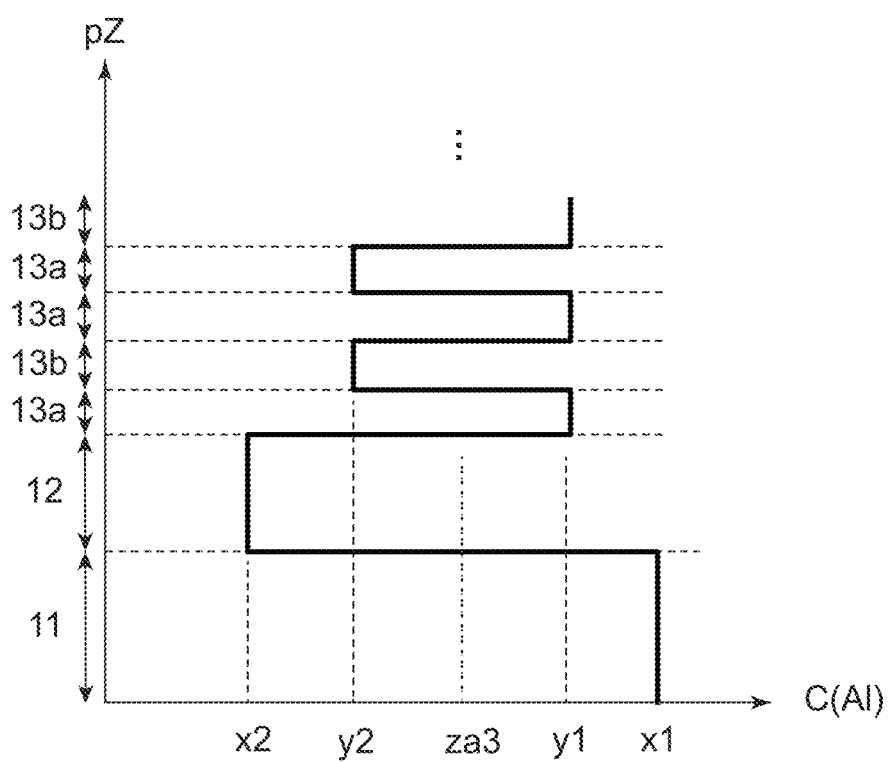
FIG. 5 is a graph view illustrating the nitride semiconductor according to the first embodiment.

FIG. 5 is a graph illustrating the nitride semiconductor according to the first embodiment.

The horizontal axis in FIG. 5 is the Al composition ratio C (Al). The vertical axis is the position pZ in the Z-axis direction. As shown in FIG. 5, the effective Al composition ratio za3 in the third nitride region 13 is between the composition ratio y1 and the composition ratio y2. For example, the Al composition ratio za3 is higher than the composition ratio x2. This makes it easy to obtain a low dislocation density DD. For example, the Al composition ratio za3 is lower than the composition ratio x1. This makes it easy to obtain a low dislocation density DD. The effective Al composition ratio za3 in the third nitride region 13 is preferably, for example, not less than 0.18 and not more than 0.28. It is easy to obtain a low dislocation density DD.

Figure 6A:
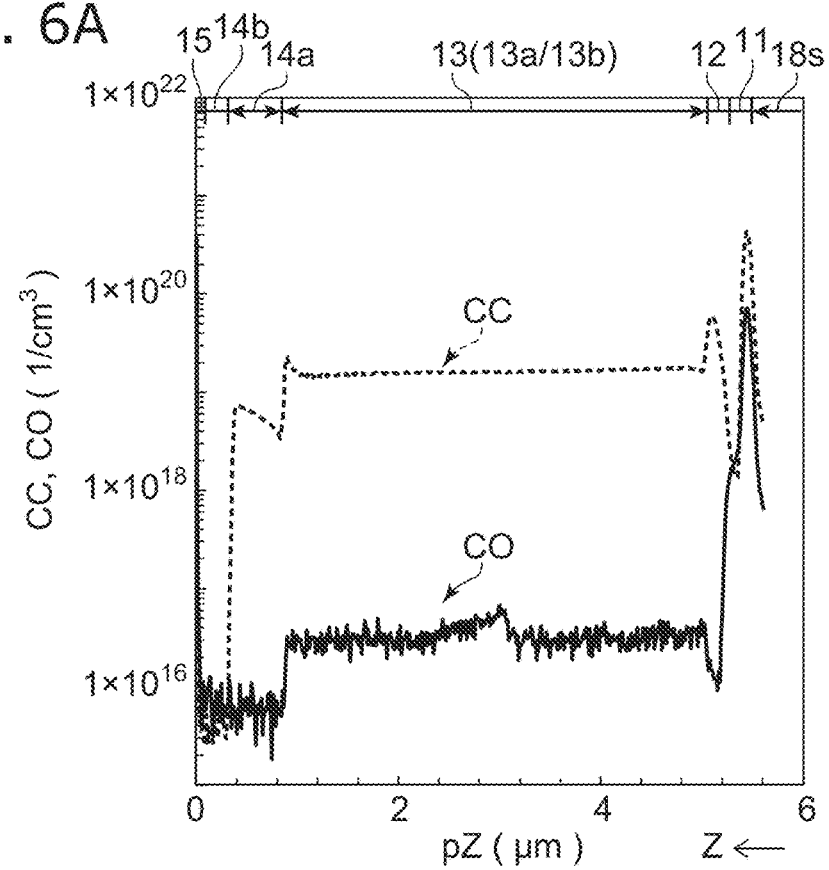
FIGS. 6A and 6B are graph views illustrating the nitride semiconductor according to the first embodiment.
Figure 6B:
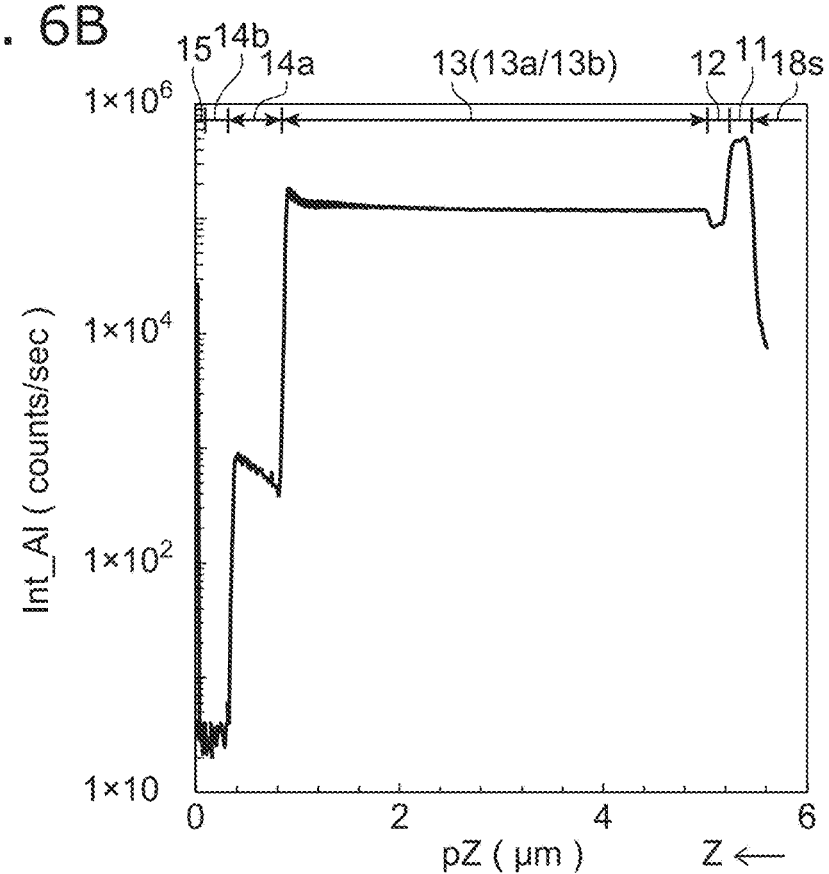

FIGS. 6A and 6B are graph views illustrating the nitride semiconductor according to the first embodiment.

These figures illustrate the results of SIMS (Secondary Ion Mass Spectrometry) analysis of the nitride semiconductor 111. In these figures, the horizontal axis is the position pZ in the Z-axis direction. The vertical axis of FIG. 6A is a carbon concentration CC or an oxygen concentration CO. The vertical axis of FIG. 6B is the secondary ion intensity Int_Al of Al.

As shown in FIG. 6B, even when the first region 13a and the second region 13b having different Al composition ratios are provided in the third nitride region 13, depending on the analysis conditions, the secondary ion intensity Int_Al of Al in the third nitride region 13 may be observed to be substantially constant.

As shown in FIG. 6A, the carbon concentration CC in the second nitride region 12 is higher than the carbon concentration CC in the third nitride region 13. As shown in FIG. 6A, the oxygen concentration CO in the second nitride region 12 is lower than the oxygen concentration CO in the third nitride region 13. With such a configuration, it is easy to obtain a low dislocation density.

For example, the carbon concentration CC in the second nitride region 12 is higher than the carbon concentration CC in the first nitride region 11. The oxygen concentration CO in the second nitride region 12 is lower than the oxygen concentration CO in the first nitride region 11.

The carbon concentration CC in the second nitride region 12 is, for example, not less than $1\times10^{19}/cm^3$ and not more than $8\times10^{19}/cm^3$ (for example, about $3.9\times10^{19}/cm^3$). The oxygen concentration CO in the second nitride region 12 is, for example, not less than $0.4\times10^{16}/cm^3$ and less than $4\times10^{16}/cm^3$ (for example, about $1.4\times10^{16}/cm^3$).

The carbon concentration CC in the third nitride region 13 is, for example, not less than $1\times10^{19}/cm^3$ and less than $2\times10^{19}/cm^3$ (about $1.5\times10^{19}/cm^3$). The oxygen concentration CO in the third nitride region 13 is, for example, not less than $3\times10^{16}/cm^3$ and not more than $5\times10^{16}/cm^3$ (for example, about $3.9\times10^{16}/cm^3$).

As described above, the carbon concentration CC in the second nitride region 12 is higher than the carbon concentration CC in the third nitride region 13. For example, the oxygen concentration CO in the second nitride region 12 is lower than the oxygen concentration CO in the third nitride region 13.

Figure 7:
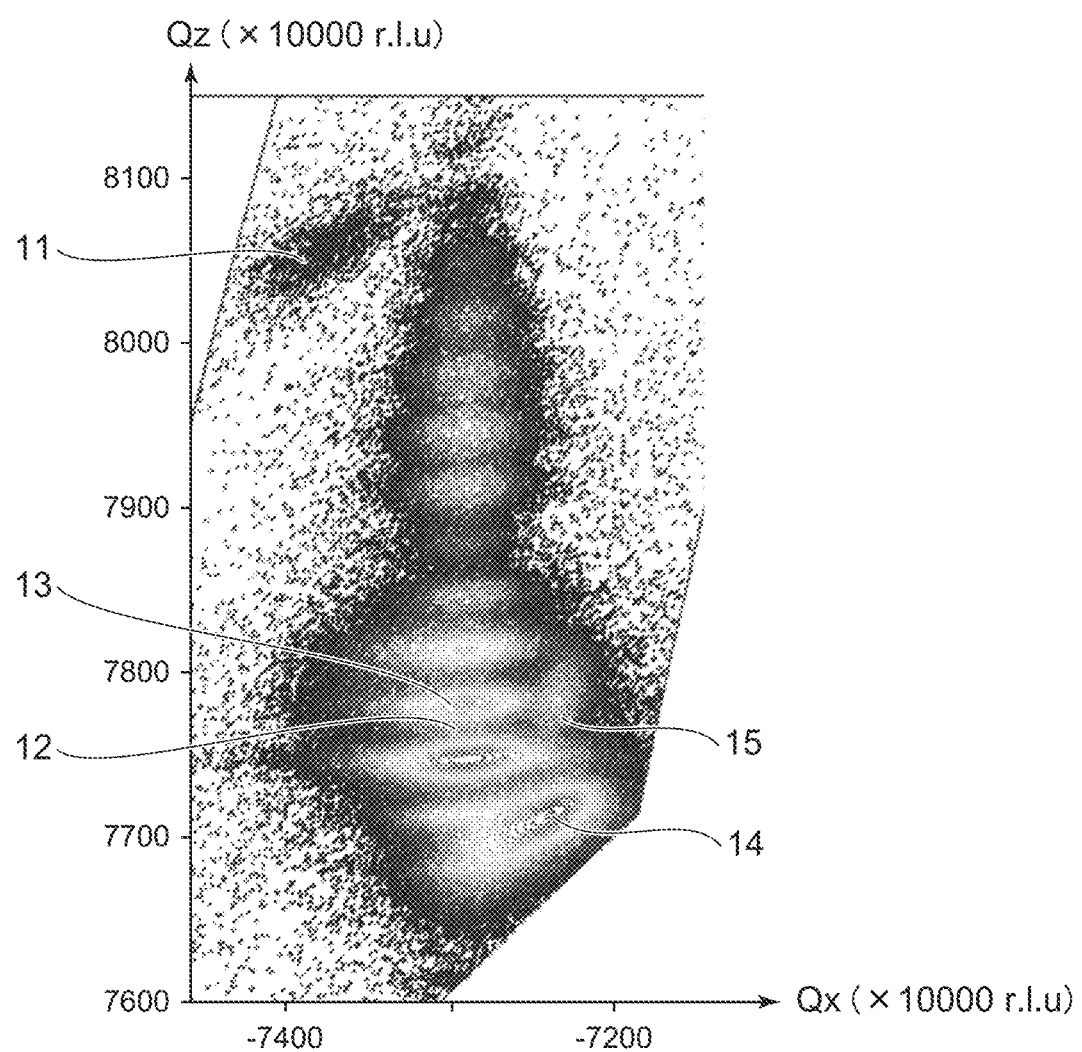
FIG. 7 is a schematic view illustrating the nitride semiconductor according to the first embodiment.

FIG. 7 is a schematic view illustrating the nitride semiconductor according to the first embodiment.

FIG. 7 is a reciprocal lattice space mapping diagram of the nitride semiconductor 111 in (20-24) asymmetric reflection. The horizontal axis of FIG. 7 is the reciprocal Qx of the lattice constant in the <20-20> direction. The vertical axis is the reciprocal Qz of the lattice constant in the <0004> direction. A large reciprocal Qz corresponds to a high Al composition ratio.

As shown in FIG. 7, the Al composition ratio (composition ratio x2) in the second nitride region 12 is lower than the effective Al composition ratio (composition ratio za3) in the third nitride region 13.

Figure 8:
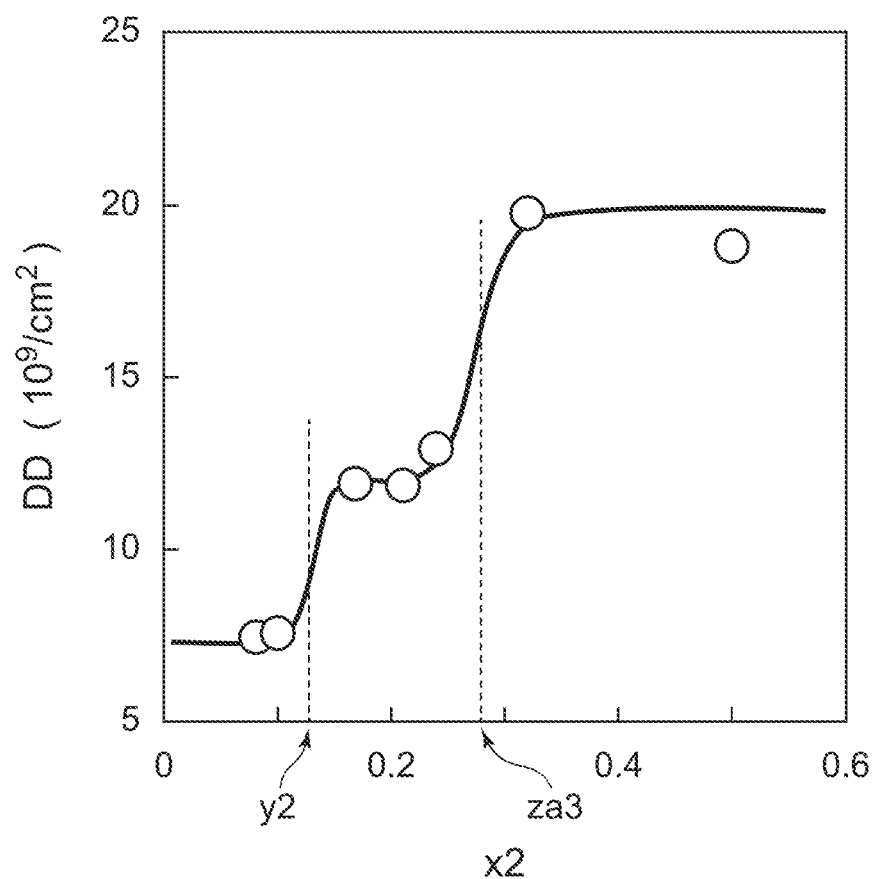
FIG. 8 is a graph view illustrating characteristics of the nitride semiconductor.

FIG. 8 is a graph view illustrating characteristics of the nitride semiconductor.

The horizontal axis of FIG. 8 is the Al composition ratio (composition ratio x2) in the second nitride region 12. The vertical axis is the dislocation density DD in the fourth nitride region 14. In the example of FIG. 8, the Al composition ratio (composition ratio y1) in the first region 13a of the third nitride region 13 is 1. The thickness t1 of the first region of the first region 13a is 5 nm. The Al composition ratio (composition ratio y2) in the second region 13b of the third nitride region 13 is 0.13. The second region thickness t2 of the second region 13b is 25 nm. The number of the multiple first regions 13a is 101. The number of the multiple second regions 13b is 100. The effective Al composition ratio za3 in the third nitride region 13 is 0.275.

As shown in FIG. 8, when the composition ratio x2 is lower than the Al composition ratio za3, the dislocation density DD becomes low. When the composition ratio x2 is not more than Al composition ratio za3, the strain applied to the third nitride region 13 becomes a tensile strain. The bending effect of dislocations is increased in the region near the interface between the second nitride region 12 and the third nitride region 13. This is considered to reduce dislocations.

As shown in FIG. 8, when the composition ratio x2 is lower than the composition ratio y2, a further lower dislocation density DD can be obtained. When the composition ratio x2 is lower than the composition ratio y2, tensile strain is effectively introduced into the second region 13b. It is considered that the bending effect of dislocations is obtained at the interface between the first region 13a and the second region 13b.

Second Embodiment

The second embodiment relates to a wafer. The wafer (wafer 210 or wafer 211) according to the embodiment includes at least a part of the nitride semiconductor (nitride semiconductor 110 or nitride semiconductor 111) according to the first embodiment and the substrate 18s (See FIG. 1 or FIG. 4). There is a first nitride region 11 between the substrate 18s and the third nitride region 13. According to the embodiment, it is possible to provide a wafer whose characteristics can be improved.

Third Embodiment

The third embodiment relates to a semiconductor device.

Figure 9:
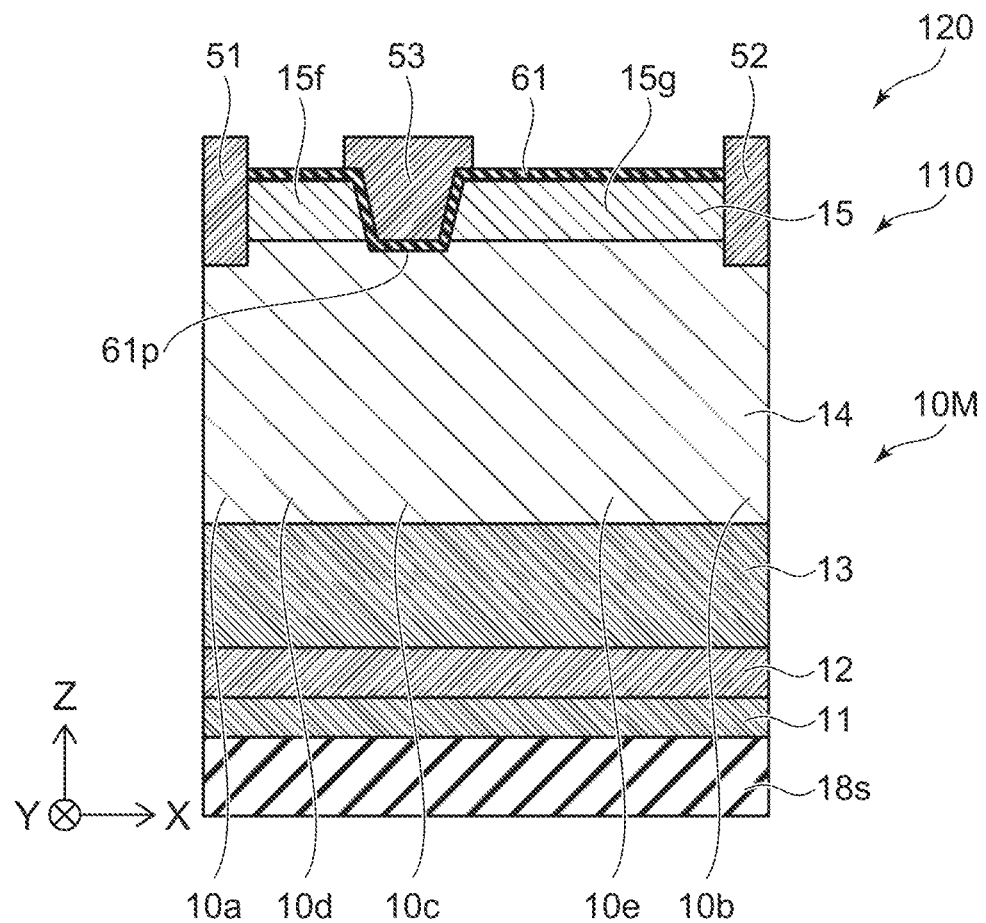
FIG. 9 is a schematic cross-sectional view illustrating a semiconductor device according to a third embodiment.

FIG. 9 is a schematic cross-sectional view illustrating a semiconductor device according to the third embodiment.

As shown in FIG. 9, the semiconductor device 120 according to the embodiment includes the nitride semiconductor according to the first embodiment (in this example, the nitride semiconductor 110), a first electrode 51, a second electrode 52, and a third electrodes 53 and an insulating member 61.

The direction from the first electrode 51 to the second electrode 52 is along the second direction crossing the first direction (Z-axis direction). The second direction is, for example, the X-axis direction. The position of the third electrode 53 in the second direction is between the position of the first electrode 51 in the second direction and the position of the second electrode 52 in the second direction.

The nitride member 10M includes the first to fifth nitride regions 11 to 15. The fourth nitride region 14 includes a first partial region 10a, a second partial region 10b, a third partial region 10c, a fourth partial region 10d, and a fifth partial region 10e. The direction from the first partial region 10a to the first electrode 51 is along the first direction (Z-axis direction). The direction from the second partial region 10b to the second electrode 52 is along the first direction. The third partial region 10c is between the first partial region 10a and the second partial region 10b in the second direction (X-axis direction). The direction from the third partial region 10c to the third electrode 53 is along the first direction. The fourth partial region 10d is between the first partial region 10a and the third partial region 10c in the second direction.

The fifth partial region 10e is between the third partial region 10c and the second partial region 10b in the second direction.

The fifth nitride region 15 includes a sixth partial region 15f and a seventh partial region 15g. The direction from the fourth partial region 10d to the sixth partial region 15f is along the first direction (Z-axis direction). The direction from the fifth partial region 10e to the seventh partial region 15g is along the first direction.

The insulating member 61 is between the nitride member 10M and the third electrode 53. For example, the insulating member 61 includes a first insulating region 61p. The first insulating region 61p is provided between the third partial region 10c and the third electrode 53 in the first direction (Z-axis direction).

The semiconductor device 120 may include a nitride semiconductor 111. In the semiconductor device 120, the current flowing between the first electrode 51 and the second electrode 52 can be controlled by the potential of the third electrode 53. The potential of the third electrode 53 is, for example, a potential based on the potential of the first electrode 51. The first electrode 51 functions as, for example, a source electrode. The second electrode 52 functions as, for example, a drain electrode. The third electrode 53 functions as, for example, a gate electrode. In one example, the semiconductor device 120 is a HEMT (High Electron Mobility Transistor). According to the embodiment, it is possible to provide a semiconductor device whose characteristics can be improved.

In the semiconductor device 120, at least a part of the third electrode 53 is between the sixth partial region 15f and the seventh partial region 15g in the second direction (for example, the X-axis direction). At least a part of the third electrode 53 may be between the fourth partial region 10d and the fifth partial region 10e in the second direction (for example, the X-axis direction). The semiconductor device 120 is, for example, a normally-off type.

Figure 10:
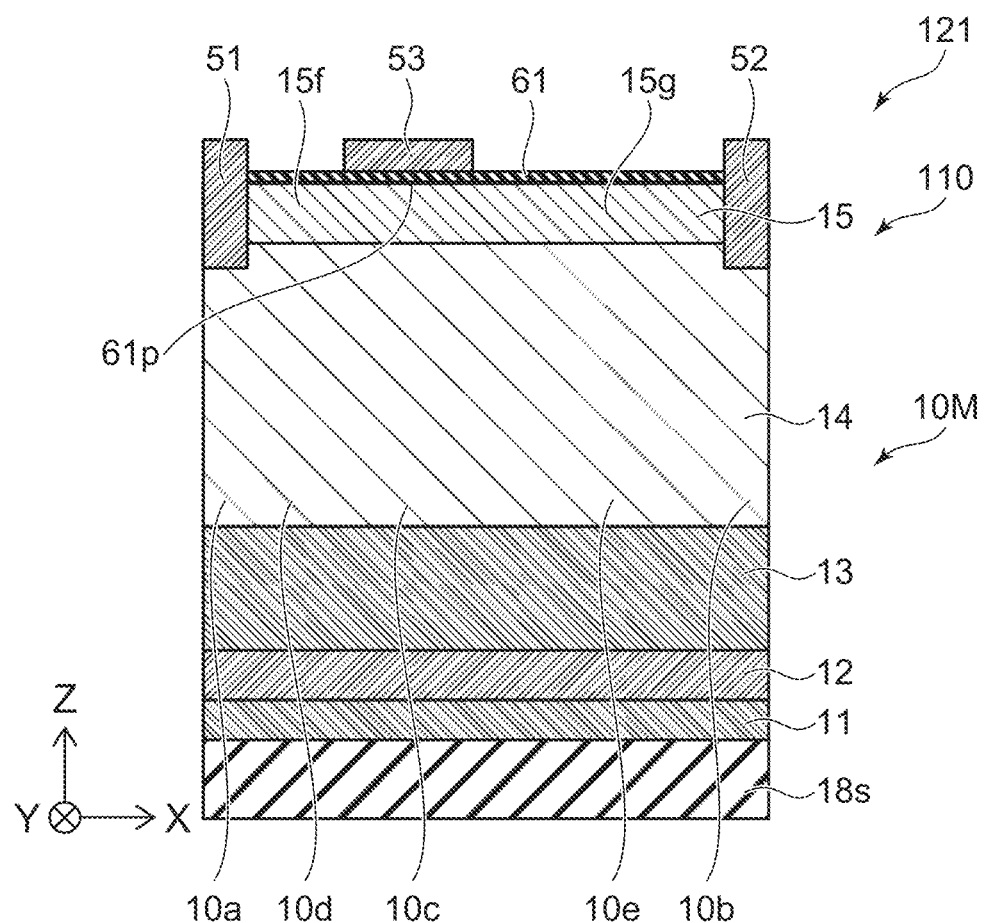
FIG. 10 is a schematic cross-sectional view illustrating a semiconductor device according to the third embodiment.

FIG. 10 is a schematic cross-sectional view illustrating a semiconductor device according to the third embodiment.

As shown in FIG. 10, a semiconductor device 121 according to the embodiment includes the nitride semiconductor according to the first embodiment (in this example, the nitride semiconductor 110), the first electrode 51, the second electrode 52, and the third electrodes 53 and the insulating member 61. In the semiconductor device 121, the third electrode 53 does not overlap the sixth partial region 15f and the seventh partial region 15g in the second direction (for example, the X-axis direction). The third electrode 53 does not overlap the fourth partial region 10d and the fifth partial region 10e in the second direction (for example, the X-axis direction). The semiconductor device 121 is, for example, a normally-on type.

Fourth Embodiment

The fourth embodiment relates to a method for manufacturing a nitride semiconductor. The method for manufacturing the nitride semiconductor according to the fourth embodiment may be applied to a method for manufacturing a wafer or a method for manufacturing a semiconductor device.

Figure 11:
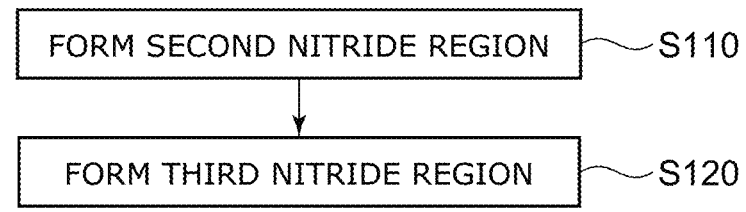
FIG. 11 is a flow chart illustrating a method for manufacturing a nitride semiconductor according to a fourth embodiment.

FIG. 11 is a flow chart illustrating the method for manufacturing the nitride semiconductor according to the fourth embodiment.

As shown in FIG. 11, the method for manufacturing the nitride semiconductor according to the embodiment includes forming the second nitride region 12 (step S110) and forming the third nitride region 13 (step S120).

In the formation of the second nitride region 12, the second nitride region 12 including $Al_{x2}Ga_{1-x2}N$ ($0<x2<1$, $x2<x1$) and including carbon is formed on the first nitride region 11 including $Al_{x1}Ga_{1-x1}N$ ($0<x1\leq1$).

In the formation of the third nitride region 13, the third nitride region 13 is formed on the second nitride region 12. The third nitride region 13 includes Al, Ga and N. The third nitride region 13 does not include carbon. Alternatively, the third carbon concentration in the third nitride region 13 is lower than the second carbon concentration in the second nitride region 12.

The carbon concentration in the second nitride region 12 can be controlled by, for example, at least one of the supply amount of the raw material gas used in the formation of the second nitride region 12 and the growth temperature. The raw material gas includes, for example, TMAl (trimethylaluminum) and TMGa (trimethylgallium). For example, when the supply amount of the raw material gas is increased, the concentration of carbon in the second nitride region 12 increases. When the growth temperature is lowered, the concentration of carbon in the second nitride region 12 increases. The carbon concentration in the third nitride region 13 can be controlled by, for example, at least one of the supply amount of the raw material gas used in the formation of the third nitride region 13 and the growth temperature. The raw material gas includes, for example, TMAl and TMGa. For example, when the supply amount of the raw material gas is increased, the concentration of carbon in the third nitride region 13 increases. When the growth temperature is lowered, the concentration of carbon in the third nitride region 13 increases. According to the embodiment, it is possible to provide a method for producing a nitride semiconductor whose characteristics can be improved.

The third oxygen concentration in the third nitride region 13 may be higher than the second oxygen concentration in the second nitride region 12. The oxygen concentration in the second nitride region 12 can be controlled by, for example, at least one of the supply amount of the raw material gas used in the formation of the second nitride region 12 and the growth temperature. The raw material gas includes, for example, ammonia and the like. For example, when the supply amount of the raw material gas is reduced, the oxygen concentration in the second nitride region 12 is reduced. When the growth temperature is increased, the oxygen concentration in the second nitride region 12 is reduced. The oxygen concentration in the third nitride region 13 can be controlled by, for example, at least one of the supply amount of the raw material gas used in the formation of the third nitride region 13 and the growth temperature. The raw material gas includes, for example, ammonia and the like. For example, when the supply amount of the raw material gas is reduced, the oxygen concentration in the third nitride region 13 is reduced. When the growth temperature is increased, the oxygen concentration in the third nitride region 13 is reduced. According to the embodiment, it is possible to provide a method for producing a nitride semiconductor whose characteristics can be improved.

In a semiconductor device using a nitride semiconductor, a low on-resistance and a high breakdown voltage can be obtained. In a semiconductor device, better characteristics can be obtained by reducing dislocations that occur in the crystal. According to the embodiment, for example, dislocations can be reduced.

In the embodiment, information regarding the shape of the nitride region and the like can be obtained by, for example, electron microscope observation. Information on the composition and element concentration in the nitride region can be obtained by, for example, EDX (Energy Dispersive X-ray Spectroscopy) or SIMS (Secondary Ion Mass Spectrometry). Information on the composition in the nitride region may be obtained, for example, by reciprocal lattice space mapping.

According to the embodiment, it is possible to provide a nitride semiconductor, a wafer, a semiconductor device, and a method for manufacturing a nitride semiconductor whose characteristics can be improved.

In the specification, "a state of electrically connected" includes a state in which multiple conductors physically contact and a current flows between the multiple conductors. "a state of electrically connected" includes a state in which another conductor is inserted between the multiple conductors and a current flows between the multiple conductors.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in nitride semiconductors such as nitride regions, substrates, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nitride semiconductors, wafers, semiconductor devices, and methods for manufacturing nitride semiconductors practicable by an appropriate design modification by one skilled in the art based on the nitride semiconductors, the wafers, the semiconductor devices, and the methods for manufacturing nitride semiconductors described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor, comprising:
    a nitride member,
    the nitride member including:
        a first nitride region including $Al_{x1}Ga_{1-x1}N$ ($0<x1\leq1$);
        a second nitride region including $Al_{x2}Ga_{1-x2}N$ ($0<x2<1$, $x2<x1$); and
        a third nitride region, the second nitride region being between the first nitride region and the third nitride region, the third nitride region including Al, Ga, and N, the third nitride region not including carbon, alternatively a third carbon concentration in the third nitride region being lower than a second carbon concentration in the second nitride region, wherein the third nitride region includes a plurality of first regions and a plurality of second regions, in a first direction from the first nitride region to second nitride region, one of the plurality of first regions is between one of the plurality of second regions and another one of the plurality of second regions, the one of the plurality of second regions is between the one of the plurality of first regions and another one of the plurality of first regions, the first region includes $Al_{y1}Ga_{1-y1}N$ ($0<y1\leq1$), and the second region includes $Al_{y2}Ga_{1-y2}N$ ($0\leq y2<y1$), a first region thickness along the first direction of each of the plurality of first regions is thinner than a second nitride region thickness along the first direction of the second nitride region, and a second region thickness along the first direction of each of the plurality of second regions is thinner than the second nitride region thickness.

2. The nitride semiconductor according to claim 1, wherein the second nitride region includes carbon, and the second carbon concentration is not less than $1\times10^{19}/cm^3$ and not more than $8\times10^{19}/cm^3$.

3. The nitride semiconductor according to claim 1, wherein the second nitride region does not include oxygen, alternatively a second oxygen concentration in the second nitride region is lower than a third oxygen concentration in the third nitride region.

4. The nitride semiconductor according to claim 3, wherein the second nitride region includes oxygen, the second oxygen concentration is not more than $4\times10^{16}/cm^3$.

5. The nitride semiconductor according to claim 1, wherein x2 is not less than 0.08 and not more than 0.28.

6. The nitride semiconductor according to claim 1, wherein an Al composition ratio in the third nitride region is higher than an Al composition ratio in the second nitride region, and lower than an Al composition ratio in the first nitride region.

7. The nitride semiconductor according to claim 6, wherein an Al composition ratio in the third nitride region is not less than 0.18 and not more than 0.38.

8. The nitride semiconductor according to claim 1, wherein y2 is higher than x2.

9. The nitride semiconductor according to claim 1, wherein y1 is not more than x1.

10. The nitride semiconductor according to claim 1, wherein a first region thickness along the first direction of each of the plurality of first regions is thinner than a first nitride region thickness along the first direction of the first nitride region, and a second region thickness along the first direction of each of the plurality of second regions is thinner than the first nitride region thickness.

11. The nitride semiconductor according to claim 1, wherein each of the plurality of first regions has a first region thickness t1 along the first direction, each of the plurality of second regions has a second region thickness t2 along the first direction, and x2, t1, t2, y1 and y2 satisfy $$x2<\{(y1\cdot t1+y2\cdot t2)/(t1+t2)\}.$$

12. The nitride semiconductor according to claim 11, wherein each of the plurality of first regions has a first region thickness t1 along the first direction, each of the plurality of second regions has a second region thickness t2 along the first direction, and x2, t1, t2, y1 and y2 satisfy $$\{(y1\cdot t1+y2\cdot t2)/(t1+t2)\}<x1.$$

13. The nitride semiconductor according to claim 1, further comprising:

a substrate, the first nitride region being between the substrate and the third nitride region.

14. A wafer, comprising:

the nitride semiconductor according to claim 1; and a substrate, the first nitride region being between the substrate and the third nitride region.

15. A nitride semiconductor, comprising:

a nitride member, the nitride member including:

a first nitride region including $Al_{x1}Ga_{1-x1}N$ ($0<x1\leq1$);

a second nitride region including $Al_{x2}Ga_{1-x1}N$ ($0<x2<1$, $x2<x1$); and a third nitride region, the second nitride region being between the first nitride region and the third nitride region, the third nitride region including Al, Ga, and N, the third nitride region not including carbon, alternatively a third carbon concentration in the third nitride region being lower than a second carbon concentration in the second nitride region, wherein the nitride member further includes a fourth nitride region including $Al_{x4}Ga_{1-x4}N$ ($0\leq x4<1$), and a fifth nitride region including $Al_{x5}Ga_{1-x5}N$ ($0\leq x5<1$, $x4<x5$), the third nitride region is between the first nitride region and the fifth nitride region, and the fourth nitride region is between the third nitride region and the fifth nitride region, the fourth nitride region includes a first film region and a second film region, the first film region is between the third nitride region and the second film region, the first film region includes carbon, and the second film region does not include carbon, alternately a carbon concentration in the second film region is lower than a carbon concentration in the first film region.

16. The nitride semiconductor according to claim 15, wherein the second nitride region does not include oxygen, alternatively a second oxygen concentration in the second nitride region is lower than a third oxygen concentration in the third nitride region.

17. The nitride semiconductor according to claim 16, wherein
the second nitride region includes oxygen,
the second oxygen concentration is not more than $4 \times 10^{16}$/cm$^3$.

18. The nitride semiconductor according to claim 15, wherein
x2 is not less than 0.08 and not more than 0.28.

19. The nitride semiconductor according to claim 15, wherein
an Al composition ratio in the third nitride region is higher than an Al composition ratio in the second nitride region, and lower than an Al composition ratio in the first nitride region.

20. A semiconductor device, comprising:
a nitride semiconductor;
a first electrode;
a second electrode;
a third electrode; and
an insulating member,
the nitride semiconductor including a nitride member,
the nitride member including,
  a first nitride region including $Al_{x1}Ga_{1-x1}N$ (0<x1≤1),
  a second nitride region including $Al_{x2}Ga_{1-x2}N$ (0<x2<1, x2<x1),
  a third nitride region, the second nitride region being between the first nitride region and the third nitride region, the third nitride region including Al, Ga, and N, the third nitride region not including carbon, alternatively a third carbon concentration in the third nitride region being lower than a second carbon concentration in the second nitride region,
  a fourth nitride region including $Al_{x4}Ga_{1-x4}N$ (0≤x4<1), and
  a fifth nitride region including $Al_{x5}Ga_{1-x5}N$ (0≤x5<1, x4<x5),
the third nitride region being between the first nitride region and the fifth nitride region,
the fourth nitride region being between the third nitride region and the fifth nitride region,
a direction from the first electrode to the second electrode being along a second direction crossing a first direction from the first nitride region to second nitride region,
a position of the third electrode in the second direction being between a position of the first electrode in the second direction and a position of the second electrode in the second direction,
the fourth nitride region including a first partial region, a second partial region, a third partial region, a fourth partial region, and a fifth partial region,
a direction from the first partial region to the first electrode being along the first direction,
a direction from the second partial region to the second electrode being along the first direction,
the third partial region being between the first partial region and the second partial region in the second direction, a direction from the third partial region to the third electrode being along the first direction,
the fourth partial region being between the first partial region and the third partial region in the second direction,
the fifth partial region being between the third partial region and the second partial region in the second direction,
the fifth nitride region including a sixth partial region and a seventh partial region,
a direction from the fourth partial region to the sixth partial region being along the first direction,
a direction from the fifth partial region to the seventh partial region being along the first direction, and
the insulating member being between the nitride member and the third electrode.

* * * * *